United States Patent [19]

Munakata et al.

[11] Patent Number: 4,464,627

[45] Date of Patent: Aug. 7, 1984

[54] DEVICE FOR MEASURING SEMICONDUCTOR CHARACTERISTICS

[75] Inventors: Chusuke Munakata; Kunihiro Yagi, both of Tokyo; Teruaki Motooka, Yamanashi, all of Japan

[73] Assignee: Hitachi, Ltd., Tokyo, Japan

[21] Appl. No.: 259,427

[22] Filed: May 1, 1981

[30] Foreign Application Priority Data

May 1, 1980 [JP] Japan .................................. 55-60409

[51] Int. Cl.³ ............................................ G01R 31/26
[52] U.S. Cl. ............................. 324/158 R; 324/158 D
[58] Field of Search ........... 324/158 D, 158 R, 158 T, 324/73 R

[56] References Cited

U.S. PATENT DOCUMENTS 4,051,437  9/1977  Lile et al. ...................... 324/158 R
4,287,473  9/1981  Sawyer ........................... 324/158 D
4,333,051  6/1982  Goodman ....................... 324/158 D Primary Examiner—Ernest F. Karlsen
Attorney, Agent, or Firm—Antonelli, Terry & Wands

[57] ABSTRACT

A device for measuring semiconductor characteristics, wherein electrodes are installed maintaining a gap on the front and back sides of a semiconductor specimen of which the characteristics are to be measured, at least one of the electrodes being transparent, the surface of the semiconductor specimen is scanned with a pulsed narrow photon beam via the transparent electrode, and a photovoltage generated between the front and back surfaces of the semiconductor specimen is taken out from the two electrodes via the capacitive coupling, in order to observe the distribution of characteristics in the surface of the semiconductor specimen.

7 Claims, 7 Drawing Figures

DEVICE FOR MEASURING SEMICONDUCTOR CHARACTERISTICS

BACKGROUND OF THE INVENTION

1. Field of the Invention

The present invention relates to a device for measuring semiconductor characteristics relying upon a photovoltaic method.

2. Description of the Prior Art

The photovoltaic method has long been employed in the field of semiconductor measurements, owing to its advantage as a non-contact measuring method over, for example, the four-point-probe method for measuring resistivity. FIG. 1 is a diagram for illustrating the fundamental principle of a conventional method of measuring resistivity distribution of semiconductor specimens utilizing a photon beam.

When a surface 2' of a semiconductor specimen 2, which spreads in a two-dimensional manner, is irradiated with a photon beam 1, electron-hole pairs consisting of holes 3 and electrons 4 usually develop on the surface 2' of the specimen 2, and diffuse toward the back surface 2" of the specimen 2 as indicated by arrows 3', 4'. In the case of silicon, as is well known, however, the electrons 4 have greater mobility than that of the holes 3. In other words, the electrons 4 move in larger number than the holes 3 toward the back surface 2". Therefore, the holes 3, having positive charge, are left in large amounts on the surface 2' of the semiconductor specimen 2 and, consequently, the surface 2' of the specimen 2 is positively charged. This phenomenon was reported in 1931 by H. Dember of Germany, and has, since then, been known as the Dember effect. The voltage produced by the Dember effect, i.e., the Dember voltage, however, is much smaller than the voltage that develops when the p-n junction is irradiated with light, and has not heretofore been utilized for any specific purposes.

The inventors of the present invention have found that the following result is obtained from the n-type wafers, such as those formed of silicon, $$\Delta V_D = \frac{(b-1)}{S} \rho(0) eI \frac{\alpha L_p^2}{\alpha L_p + 1} \frac{V_p}{S_f + V_p} \quad (1)$$

where $\Delta V_D$ denotes a Dember voltage, and each of the symbols has the following meaning:

b: mobility of electrons/mobility of holes,
S: area of wafer,
$\rho(0)$: resistivity of the wafer surface,
e: electric charge of the electron,
I: intensity of the photon beam (photon flux/sec),
$\alpha$: photon beam absorption coefficient,
$L_p$: diffusion length for minority carriers,
$V_p$: diffusion velocity for minority carriers
$S_f$: recombination velocity of carriers on the wafer surface.

As is obvious from the equation (1) above, the Dember voltage is dependent upon many factors. If all of the factors except for the resistivity $\rho(0)$ are regarded as being constant, the above equation can be written as, $$\Delta V_D = K \cdot \rho(0) \quad (2)$$

where K is a constant.

Namely, if the semiconductor specimen (wafer) 2 without the junction is scanned by converging the photon beam 1 and if the distribution of photovoltage at that time is measured, the measured result is a Dember voltage, which, finally, is equal to the measurement of resistivity distribution on the surface of the specimen 2.

A Schottky junction has heretofore been used to detect the distribution of resistivity. FIG. 2 illustrates a fundamental principle thereof. An ohmic electrode 6 is attached to the back surface 2" of the semiconductor specimen 2, a metal probe 5 is erected on the surface of the specimen 2, and the vicinity of the probe 5 is irradiated with the photon beam 1. As is well known, a photovoltage develops in the Schottky junction 5' and is measured by a voltmeter 7. Usually, the intensity of the photovoltage depends upon the resistivity of the portion of the specimen 2 to which the metal probe 5 is opposed. Therefore, the indication of the voltmeter 7 varies in proportion to the resistivity. As for the surface 2 of a wide wafer, the metal probe 5 needs to be simply moved. In practice, however, this operation is not practical. As shown in FIG. 3, therefore, mesh electrodes 8 are pressed with pressure onto the specimen 2 to form a Schottky junction 8" on the whole surface. By scanning the specimen 2 with the photon beam 1, it is possible to detect the distribution of resistivity on the surface 2'.

The conventional method shown in FIG. 3, however, has defects. First, characteristics of the Schottky junction 8" depend on the mechanical pressure of the metal, surface conditions of the metal (roughness, oxide layer, etc.), and surface conditions of the semiconductor (oxide layer, humidity, dust, etc.), which make it difficult to form a uniform junction over wide areas. Second, portions of the surface are covered with mesh electrodes 8, so the whole surface of the specimen 2 is not irradiated with the photon beam 1. Third, attachment of the ohmic electrode 6 damages the specimen 2, and makes it difficult to carry out a perfect non-destructive insepection.

Measuring the characteristics of the specimen 2 by forming a Schottky junction using an electrolyte 13 such as $Na_2SO_4$ as one electrode as shown in FIG. 4, based upon the same principle as the method of FIG. 3 has also been reported. The electrolyte 13, however, involves clumsy operation if it is attempted to use it as a transparent electrode. Further, the ohmic electrode 6 must be attached onto the back surface, as in the above-mentioned prior art. In FIG. 4, reference numeral 12 denotes an electrode, and 14 denotes a side wall of a vessel for storing the electrolyte.

As mentioned above, there has not heretofore been known any method of photovotaically measuring the resistivity distribution of the surface of the silicon wafer without damaging the specimen being measured.

SUMMARY OF THE INVENTION

The object of the present invention is to provide a device for photovotaically measuring the distribution of characteristics in the surface of the semiconductor specimen without damaging the semiconductor specimen.

In order to accomplish this objective, the device according to the present invention is characterized in that electrodes are attached to both surfaces of a semiconductor specimen of which the characteristics are to be measured maintaining a gap, at least one of the electrodes is transparent, the surface of the semiconductor specimen is scanned by a narrow pulsing photon beam through said transparent electrode, and the photovoltage generated between the two electrodes is measured through the capacitive coupling to determine the distribution of characteristics of the surface of the semiconductor specimen.

In a more advantageous setup of the present invention, transparent electrodes are attached to both sides of the specimen, and the light which passes through the semiconductor specimen is also detected to measure the absorbency as well as the photovoltage.

DESCRIPTION OF THE PREFERRED EMBODIMENTS

Figure 1:
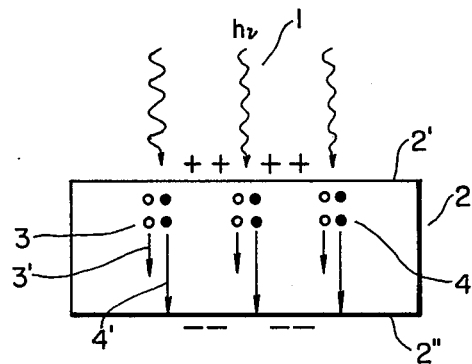
FIG. 1 is a diagram illustrating a fundamental principle for measuring the resistivity distribution of a semiconductor specimen using a light beam.
Figure 2:
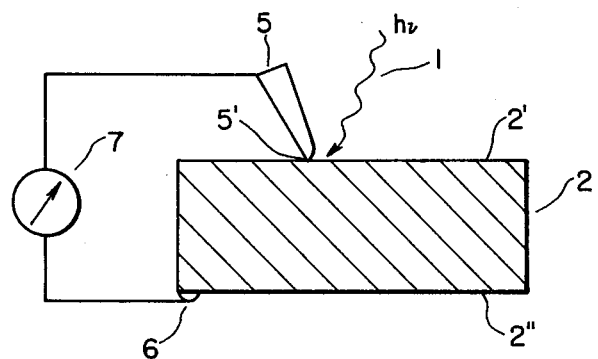
FIGS. 2 to 4 are diagrams illustrating principles of the conventional devices for measuring the characteristics of semiconductor specimens by using a light beam.
Figure 3:
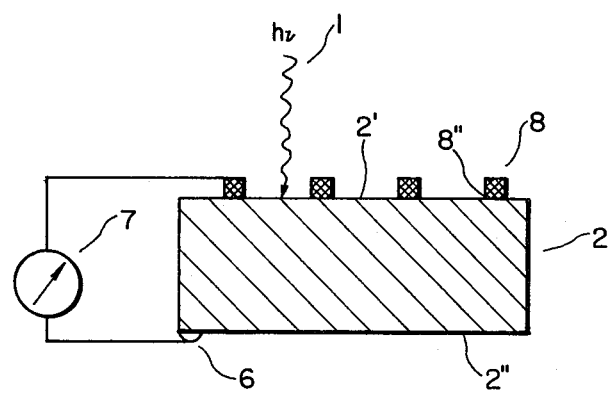
Figure 4:
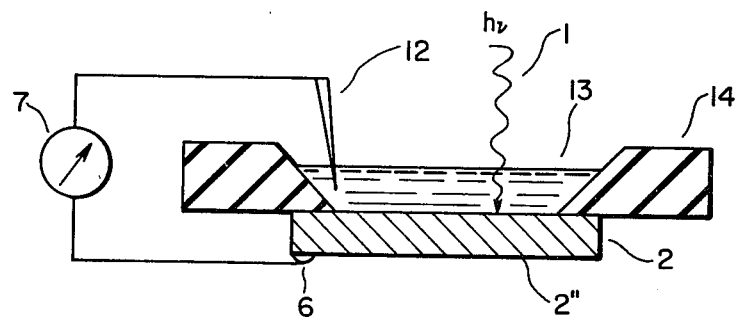
Figure 5:
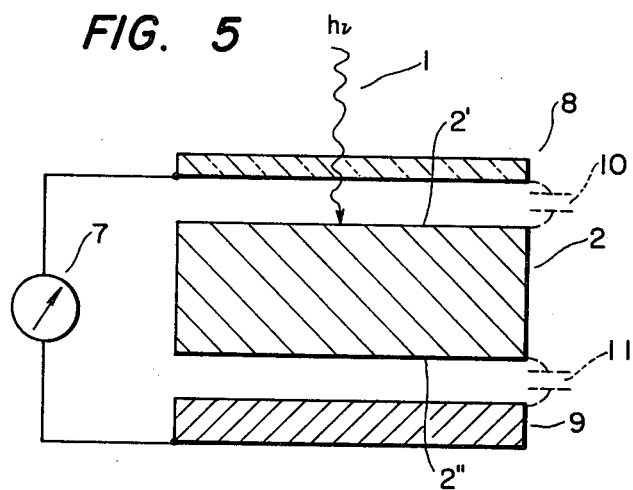
FIG. 5 is a diagram illustrating the principle of the present invention.

FIG. 5 shows the principle of a measuring method according to the present invention. Namely, according to the present invention, a Dember voltage can be correctly measured when a given portion of the specimen 2 is irradiated with photon beam 1. As mentioned already, the Dember voltage generates between the front surface 2' and the back surface 2" of the specimen 2. Therefore, electrodes 8, 9 are attached to such surfaces maintaining a clearance. If the photon beam 1 is converted into pulses, the Dember voltage is also generated in the form of pulses. Therefore, even if the electrodes 8, 9 are separated from the specimen 2, it is possible to detect the Dember voltage owing to the capacitive coupling that results from air gap capacitances 10, 11.

Figure 6:
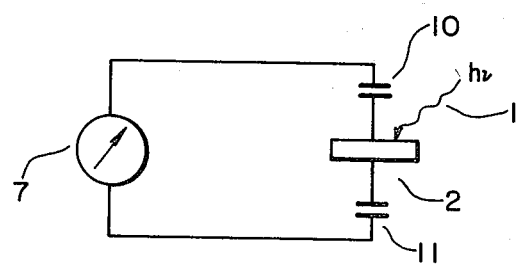
FIG. 6 is a diagram of a circuit equivalent to FIG. 5.

FIG. 6 illustrates an equivalent circuit of FIG. 5. Capacitances 10 and 11 are present above and below the specimen 2, generating voltage upon irradiation with the photon beam 1, and a voltmeter 7 is connected to generating specimen 2 via capacitances 10, 11.

Referring to FIG. 5, a transparent electrode 8 is formed by, for example, coating the surface of glass with indium oxide. Owing to the transparent electrode 8, the photon beam 1 is permitted to reach the specimen 2 without being greatly absorbed. The electrode 9 may be either a transparent one like electrode 8 or an opaque one.

In principle, therefore, the semiconductor specimen 2 is placed between electrode 8 and electrode 9 without being in direct contact with them. Therefore, this method is a completely non-destructive method.

Figure 7:
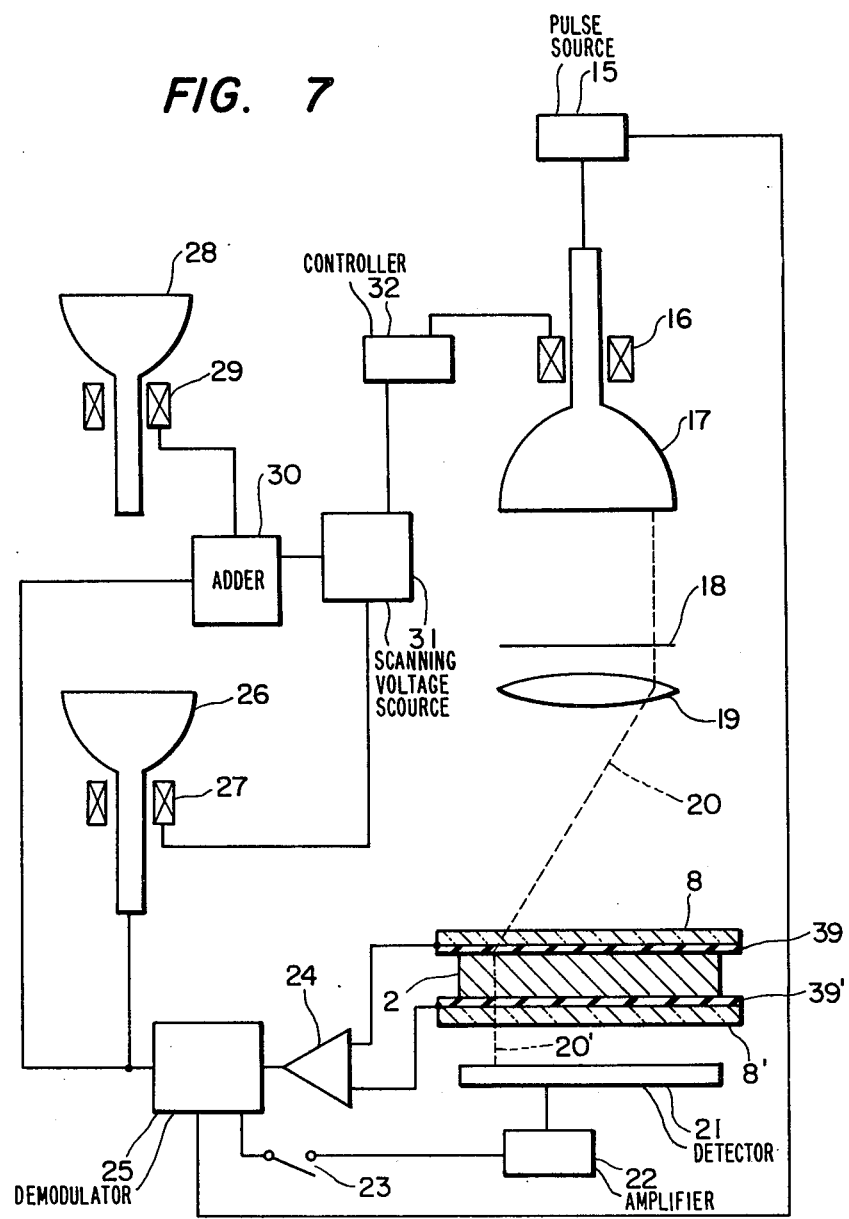
FIG. 7 is a block diagram of a device for measuring semiconductor characteristics according to an embodiment of the present invention.

FIG. 7 illustrates an embodiment of a device using the present invention, in which a cathode-ray tube 17 is used as a light source for photon beam 20. The wavelengths of the photon beam 20 are trimmed to a suitable range through an optical filter 18, and it is focused onto the semiconductor specimen 2 by an optical lens 19. The photon beam 20 can be scanned by scanning the electron beam (not shown) in the cathode-ray tube 17. The scanning velocity and scanning area are adjusted by suitably controlling the voltage from a scanning voltage source 31 by a controller 32, and supplying a current converted from the voltage to a deflection coil 16. The same scanning signals are fed to deflection coils 27, 29 of cathode-ray tubes 26, 28 for indicating the scanning picture. In the cathode-ray tube 28, in particular, the signals from the semiconductor specimen 2 are superposed on a deflection current by an adder 30. As is well known, the amplitude-modulated scanning picture is obtained if signals from the semiconductor specimen 2 are added to the deflection coil 29.

FIG. 7 illustrates the specimen 2 sandwiched between the two transparent electrodes 8, 8' to detect the intensity and wavelength distribution of the photon beam 20' which has passed through the specimen 2. Namely, if the transmitted light 20' is detected and analyzed by a detector 21, consisting of a photodiode, and if the output is amplified through an amplifier 22, it is possible to obtain the impurity concentration by a well-known principle. Consequently, which factor among the factors of Dember voltage in equation (1) gives the most pronounced effect can be more reliably determined, to obtain increase synergistic effects. For instance, if the Dember voltage varies greatly while no change develops in the intensity of the transmitted light 20', it is proper to consider that the surface recombination speed $S_f$ has changed quickly rather than to consider that the resistivity $\rho(0)$ has changed.

According to the present invention as already mentioned, the Dember voltage is measured by capacitive coupling. For this purpose, the photon beam 20 is converted into pulses. The pulsation is accomplished by pulsing the electron beam of the cathode-ray tube 17 by modulating the brightness of the cathode-ray tube 17 with a pulse source 15. The pulse voltage is also used for phase-sensitive demodulating of the signals. In other words, the pulse voltage is used as a reference voltage for a phase-sensitive demodulator 25, which markedly improves the signal-to-noise ratio of the signals.

The amplified and phase-sensitive demodulated signals are used for modulating the brightness of the cathode-ray tube 26 and also for modulating the amplitude of the cathode-ray tube 28.

Referring again to FIG. 7, spacers 39, 39' are inserted between the electrodes 8, 8' and the specimen 2, such that the specimen 2 can be brought adjacent to the electrodes 8, 8' without being damaged. The spacers 39, 39' will be made of a light-transmitting insulating film such as mica, Mylar, polyethylene, or the like, and will have a thickness of several tens of microns or smaller.

An embodiment of the present invention was illustrated in the foregoing with reference to FIG. 7. According to the present invention, however, the light source is not restricted to cathode-ray tube 17 only, but may be another source of light such as a laser. Further, the photon beam 20 can be scanned by a moving mirror.

Further, although the foregoing description has dealt with the case of measuring the resistivity distribution only, it is possible to measure any of the other characteristics in equation (1). Moreover, the device of the present invention can be used to measure the characteristics of wafers having a p-n junction formed by ion implantation or having a junction consisting of regions of the same type of conductivity but having different impurity concentrations, wafers having an oxide film or having an oxide film which contain a fixed charge therein, as well as wafers having surface (or interface) states. In the case of wafers having a p-n junction, for example, the uniformity of junction is displayed on the display tube within short periods of time. Therefore, whether the wafer can be used for producing solid-state circuit elements, or not can be readily discriminated, to present great merit from an industrial point of view.

What is claimed is:

1. A device for measuring semiconductor characteristics comprising: photon beam irradiation means which scans and irradiates the surface of a semiconductor specimen with a pulsed and converged photon beam; electrodes respectively disposed opposite front and back surfaces of said specimen with a capacitive coupling gap being located between each electrode and the respective opposite surface of the specimen, through which photovoltage generated between the front surface and the back surface of said specimen by the irradiation with said photon beam is taken out by said electrodes, at least one of said electrodes located on the side irradiated with the said photon beam being capable of transmitting light; signal extract means for taking out only the signal components of said photovoltage by comparing the output signals taken out by said electrodes with pulsed signals and said photon beam; and observation means which displays said signal components relative to irradiated portions of said photon beam, so that changes in the output from said signal extract means can be observed.

2. A device for measuring semiconductor characteristics according to claim 1, wherein said photon beam irradiation means consists of a cathode-ray tube, a pulse source connected to said cathode-ray tube to modulate the brightness, a scanning source connected to a deflection coil of said cathode-ray tube to effect the deflection, and an optical lens which is disposed between said cathode-ray tube and said specimen to converge the photon beam.

3. A device for measuring semiconductor characteristics according to claim 2, wherein an optical filter is installed between said cathode-ray tube and said optical lens to trim the wavelengths of said photon beam.

4. A device for measuring semiconductor characteristics according to claim 1, wherein said electrodes are supported on said specimen via spacers in the form of a light-transmitting and electrically insulating plate.

5. A device for measuring semiconductor characteristics according to claim 1, wherein said signal extract means is a phase-sensitive demodulator.

6. A device for measuring semiconductor characteristics according to claim 1, wherein said observation means is a cathode-ray tube which is brightness-modulated by said signal components.

7. A device for measuring semiconductor characteristics according to claim 1, wherein said observation means is a cathode-ray tube which is amplitude-modulated by said signal components.

* * * * *